US006215128B1

(12) United States Patent
Mankos et al.

(10) Patent No.: US 6,215,128 B1
(45) Date of Patent: Apr. 10, 2001

(54) COMPACT PHOTOEMISSION SOURCE, FIELD AND OBJECTIVE LENS ARRANGEMENT FOR HIGH THROUGHPUT ELECTRON BEAM LITHOGRAPHY

(75) Inventors: Marian Mankos, San Francisco; Lee H. Veneklasen, Castro Valley, both of CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/272,086

(22) Filed: Mar. 18, 1999

(51) Int. Cl.[7] .................................................... H01J 37/30
(52) U.S. Cl. ...................... 250/492.24; 250/398
(58) Field of Search ........................... 250/492.24, 398, 250/492.22, 492.2

(56) References Cited

U.S. PATENT DOCUMENTS

| 4,460,831 | * | 7/1984 | Oettinger et al. | 250/492.24 |
| 4,820,927 | | 1/1989 | Langner et al. | 250/492.2 |
| 5,156,942 | | 10/1992 | Aton et al. | 430/296 |
| 5,294,801 | | 3/1994 | Aton et al. | 250/492.22 |
| 6,054,713 | * | 4/2000 | Miyake et al. | 250/492.24 |

FOREIGN PATENT DOCUMENTS

| 0 881 542 A1 | 12/1998 | (EP) . |
| 2 260 666 | 4/1983 | (GB) . |
| 2 164 787 | 3/1986 | (GB) . |
| WO 99/48129 | 9/1999 | (WO) . |

OTHER PUBLICATIONS

PCT International Search Report & Transmittal PCT/US 00/07060, 12 Sep., 2000.

* cited by examiner

Primary Examiner—Kiet T. Nguyen
(74) Attorney, Agent, or Firm—Skjerven, Morrill, MacPherson LLP; Greg Leitich

(57) ABSTRACT

An improved compact tandem photon and electron beam lithography system includes a field lens adjacent the photoemission source which is utilized in combination with an objective lens to minimize field aberrations in the usable emission pattern and minimize the interaction between electrons to improve the throughput of the system. If desired, a demagnifying lens can be utilized between the field lens and the objective lens to increase the demagnification ratio of the system.

22 Claims, 4 Drawing Sheets

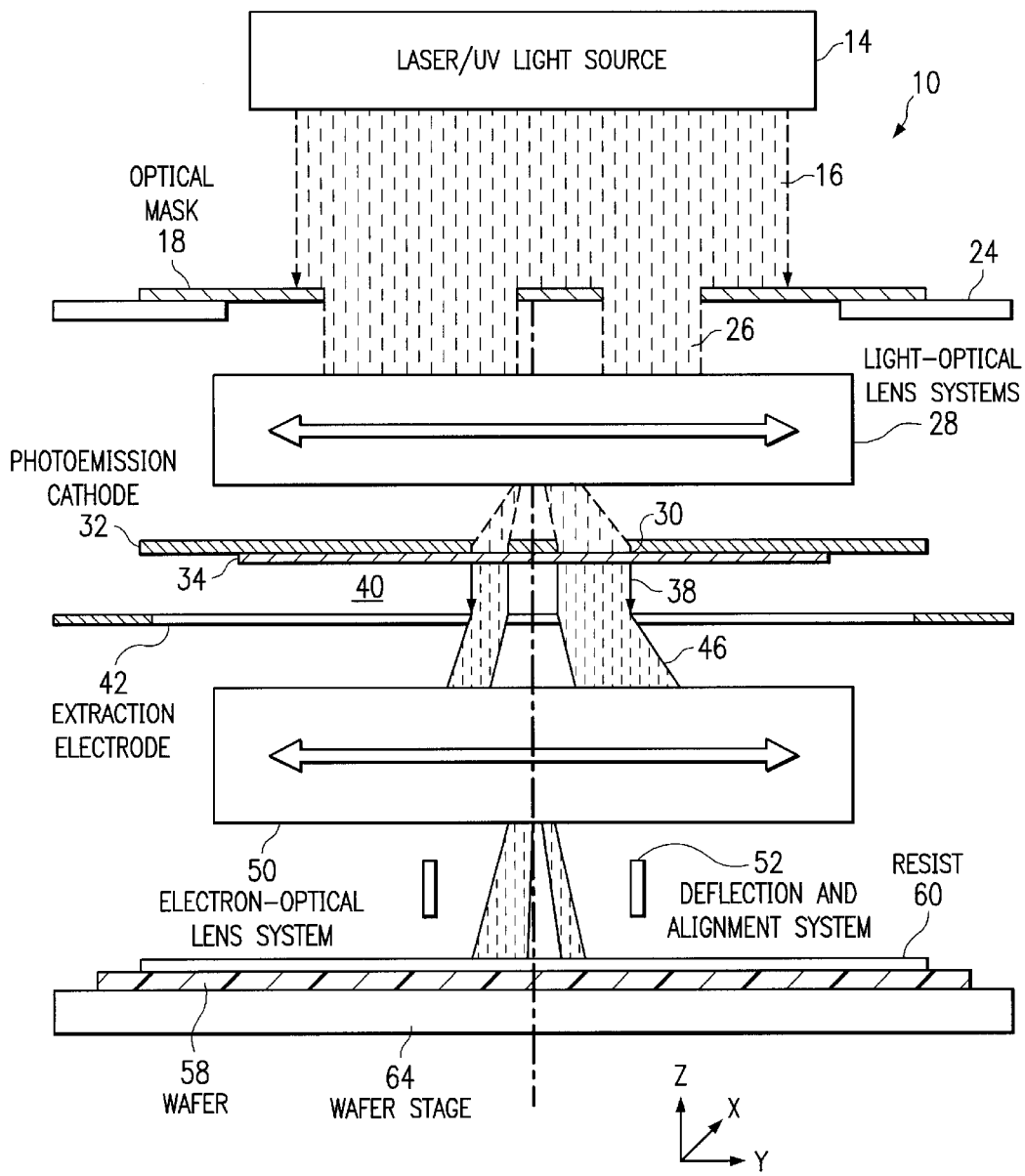

COMPACT PHOTOEMISSION SOURCE, FIELD AND OBJECTIVE LENS ARRANGEMENT FOR HIGH THROUGHPUT ELECTRON BEAM LITHOGRAPHY

CROSS REFERENCE TO RELATED APPLICATION

This is a application relates to of U.S. Ser. No. 09/045,728, filed on Mar. 20, 1998, now abandoned the disclosure of which is incorporated by reference.

BACKGROUND OF THE INVENTION

1. Field of the Invention

This invention relates to lithography and more specifically to electron beam lithography for semiconductor device fabrication.

2. Description of Related Art

There are two general categories in the field of lithography. The first is photolithography (light lithography) which images patterns on a substrate, typically a semiconductor wafer, using a mask which is a pattern through which a beam of light is passed and imaged onto the surface of the substrate. The surface of the substrate carries a layer of photosensitive resist which is thereby exposed by the mask pattern. Later steps of developing the photoresist and etching the substrate are performed to form a pattern replicating the image of the mask on the wafer.

A second category of lithography is electron beam (or charged particle beam) lithography in which a beam of e.g. electrons from an electron source is directed onto a substrate. The electrons expose a resist layer (in this case an electron sensitive resist) on the substrate surface. Electron beam lithography uses what are called "electron lenses" to focus the electron beam. These are not optical (light) lenses but are either electro-static or magnetic. Typically electron beam lithography is used for making masks; however it can also be used for direct exposure of semiconductor wafers. The systems used in photolithography or electron beam lithography are well known and include a source of light or electrons, optical or electron beam lenses, and stages for supporting the substrate and the mask (reticle).

Typically electron beam lithography does not use a pattern (mask) but instead is "direct write" in which the beam is scanned and turned on and off (blanked) to determine the patterns imaged on the substrate. It is also known to use electron beams in conjunction with masks. The chief disadvantage of electron beam direct write lithography is its relatively slow exposure rate, making it generally uneconomic for semiconductor wafer fabrication.

As is well known, the primary goal in lithography in the semiconductor field is to define smaller feature sizes, where feature size is usually the minimum width of a portion of a transistor or interconnection. Generally photolithography and electron beam lithography have followed different evolutionary steps. Photolithography has achieved its present dominant position in semiconductor device fabrication by concentrating on mask techniques using a mask (reticle) which defines the actual image. These techniques utilize a highly efficient parallel projection scheme whereby a single reticle is used repeatedly to project the identical image onto different portions of the semiconductor wafer.

In contrast, typical applications of high resolution electron beam lithography are limited to mask-making and to limited manufacturing of specialized (low production) integrated circuits due to the inherent low throughput in direct write lithography and high equipment cost. However, since the general trend in semiconductor fabrication is to reduce minimum feature size progressively, it is expected that a typical minimum feature size will be less than 100 nanometers (nm) in about ten years and at that time optical lithography may become too expensive and not offer sufficient resolving power due to the relatively large wavelength of light.

At the same time, current electron beam technology is not regarded as economic even in the long term for mass production of semiconductor devices.

An improved combined light and electron lithography process and apparatus which takes advantage of the high throughput of photolithography and the high spatial resolution of electron beam lithography, is disclosed in parent application, U.S. Ser. No. 09/045,728, filed on Mar. 20, 1998, entitled "Tandem Optical Scanner/Stepper And Photoemission Converter For Electron Beam Lithography". The parent application discloses a system for carrying out the combined method by combining two subsystems, the first of which is a conventional photolithography tool, for instance a stepper or scanner, and the second of which is a demagnifying electron beam column. These two subsystems are coupled by a photoemission cathode.

The photo and electron beam subsystems are arranged serially. The photolithography subsystem transfers one to one or a demagnified image (demagnified for instance four to five times) of the conventional mask (reticle) onto the photoemission cathode, which couples the photo subsystem to the electron beam subsystem. The photoemission cathode converts the incident light (photons) into an electron beam emission pattern and the electron optics project a demagnified electron image of the mask onto the wafer surface.

The photon subsystem is based for instance on a conventional stepper or scanner of the type now commercially available, while the electron beam subsystem includes the photoemission cathode, extraction electrode and demagnifying lenses, each of which are essentially conventional. When a scanner is used in the photon subsystem, the wafer is written on the fly, i.e. both the mask (reticle) and wafer move at constant velocities in proportion to total demagnification. In the other case when a stepper is used as the photon subsystem, the wafer is written when both the mask and wafer stop. The exposure begins after the mask and wafer are moved in the appropriate position.

A unique feature of the parent application composite system is that the optical lenses of the photolithography subsystem can be used to compensate for distortion aberrations in the electron beam lens (or visa versa). Applications of the system and method in accordance with the parent application include electron beam lithography tools for electron beam direct writing of wafers and for mask making with high throughput by combining photolithography and high resolution electron beam lithography for exposure.

SUMMARY

In accordance with the present invention, an improved compact tandem photon and electron beam lithography system is provided. The improved system includes a field lens adjacent the photoemission source which is utilized in combination with an objective lens to minimize field aberrations in the usable emission pattern and minimize the interaction between electrons to improve the throughput of the system. If desired, a demagnifying lens can be utilized between the field lens and the objective lens to increase the demagnification ratio of the system.

BRIEF DESCRIPTION OF THE DRAWING

FIG. 1 illustrates a schematic side view of a tandem photon and electron beam lithography system in accordance with the parent application, U.S. Ser. No. 09/045,728.

Utilization of the same reference numerals in different Figures indicates similar or identical elements, structurally and/or functionally.

DETAILED DESCRIPTION OF THE PREFERRED EMBODIMENTS

Figure 3:
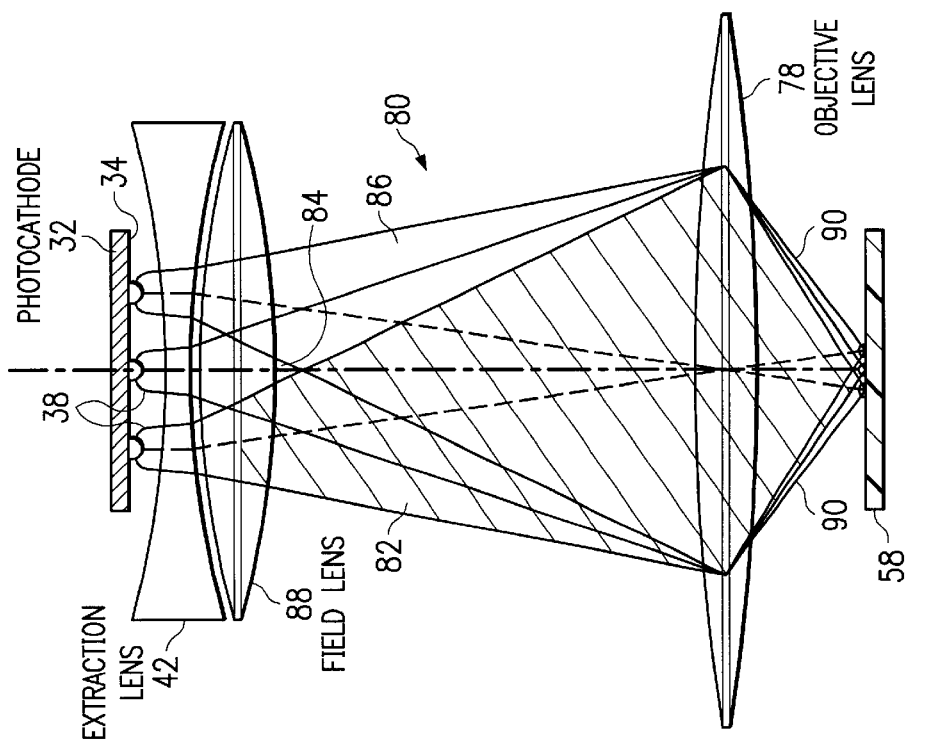
FIG. 3 illustrates a schematic side view of an improved compact tandem photon and electron beam lithography system in accordance with one embodiment of the present invention.

FIG. 1 shows in a side view a tandem photon and electron beam lithography system ("tool") 10 in accordance with the parent application, U.S. Ser. No. 09/045,728 which includes two subsystems, the first of which is a conventional photolithography tool, for instance a stepper or scanner, and the second of which is a demagnifying electron beam column, where the two subsystems are coupled by a photoemission cathode.

A conventional mask 18 (reticle) of the type now used in photolithography is positioned on a conventional stage 24 which may or may not be movable along one or both of the depicted x and y axes, depending on the type of photolithography subsystem. A source of the light is for instance a conventional UV light source or a laser illumination system 14 of the type now used in photolithography which provides a relatively large diameter beam 16 of for instance ultraviolet (UV) light which passes through the transparent portions of the mask 18. It is to be understood that the mask is a substrate transparent to the incident light 16 on which are located opaque areas. The transparent portions of the substrate define the image which is to be transferred by the mask 18. Typically, one such mask includes the entire pattern of one layer of a single integrated circuit die. The mask is usually, in terms of its X, Y dimensions, some convenient multiple of the size of the actual die being imaged.

A light optical lens system 28 (which is actually a lens system including a large number of individual lens components) focuses the light 26 passed by the mask 18. The light optical lens system 28 is either a 1:1 or demagnifying lens system which demagnifies by e.g. a factor of four or five the image 26 incident thereon to form image 30, which in turn is incident onto the object. A 1:1 ratio is more advantageous when mask size is limited. In this case the object, rather than being a semiconductor substrate, is the photosensitive backside of a photoemission cathode 32. The photoemission cathode 32 defines for instance a minimum feature size of 0.5 micrometers or less, the minimum feature size of course being dependent upon the parameters of the system. The photoemission cathode 32 is for example a thin gold (or other metal) layer deposited on a transparent substrate.

The photoemission cathode 32 (which like the other elements herein is shown in simplified fashion) includes a photoemission cathode layer 34 which absorbs the incident photons 26 and causes electrons present in the photoemission layer 34 to be ejected from the layer 34. Some portion of the electrons 38 which retain sufficient energy to escape from the photoemission layer 34 are emitted into the vacuum portion 40 of the photoemission cathode downstream from the photoemission layer 34. An electric voltage (typically tens of kilovolts) is applied to the extraction electrode 42 associated with the photoemission cathode 32. Extraction electrode 42 extracts the electrons 38 which have escaped from the photoemission layer 34 and accelerates them. Thus the accelerated electrons 46 form a virtual image of the incident photons 30. In effect then the photoemission cathode 32 and extraction electrode 42 form a divergent lens.

There may also be, immediately downstream of the extraction electrode 42, a magnetic (or electrostatic) lens (not shown) to reduce aberrations. (A magnetic lens is conventionally a set of coils and magnetic pole pieces, and yokes which focus the electron beam.) Such an electron beam system has been found to offer resolution of below 10 nm. Immediately following (downstream of) this portion of the system is a conventional electron optical lens system 50 consisting of one or more elements forming a deflection system 52 (shown only schematically in FIG. 1).

This lens system further demagnifies the virtual image 46 at the writing plane, which is the plane of the principal surface of the wafer 58 (substrate) by a factor determined to achieve the desired minimum feature size. For instance, if a minimum feature size of 0.5 $\mu$m is resolved at the photoemission cathode, an electron beam demagnification factor of five times is needed for a 100 nanometer minimum feature size on the wafer 58. This means that when a total area of approximately 1 mm×1 mm is exposed on the wafer 58, a total illuminated area of 5 mm×5 mm is required on the photoemission cathode layer 34. Correspondingly for a 4:1 light/optical demagnification ratio an area of 20 mm×20 mm is illuminated on the mask 18, and a 5 mm×5 mm area is illuminated for a 1:1 ratio. Of course these are merely illustrative parameters.

The total demagnification factor and exposed wafer area can be varied to achieve the desired minimal feature size. The wafer 58, including its electron beam resist layer 60, is typically supported on a stage 64 which is movable in the x and y axes (optionally also in the z axis), as is conventional. Other elements of both the photo and the electron beam subsystems which are well known are not shown, but include positioning measurement systems using for instance laser interferometry to determine the exact location of the mask on its stage and the wafer on its stage, vacuum systems, supports for the stages, various vibration absorption and isolation mechanisms to reduce environmental effects, and suitable control systems, all of the type well known in the lithography field.

The deflection system 52 can be used to compensate for positionary errors due to mask/wafer misalignment, vibrations, heating and other effects, and would only use very small deflection amplitudes.

When the photo subsystem is a stepper type system, the required area on the wafer 58 is exposed with both the mask stage 24 and wafer stage 64 in a stationary position. Thus after each single exposure both the mask and wafer stage are moved (stepped) to the next location and stopped before another exposure is started. Each exposure could possibly expose a single die area on the wafer 58, but field size limitations would usually require a die to be composed using several steps. In the case of a scanner, both the mask stage 24 and the wafer stage 64 move at constant velocities in the ratio of the demagnification utilized and the exposure is continuous, as is well known for scanning lithography. The ratio of the stage velocities is determined conventionally by the total demagnification factor.

This tandem arrangement shown in FIG. 1 can be used to optically compensate in light optical lens system 28 for distortions of the electron optical lens system 50. This allows a larger exposure field, which increase throughput of the entire system.

Figure 2:
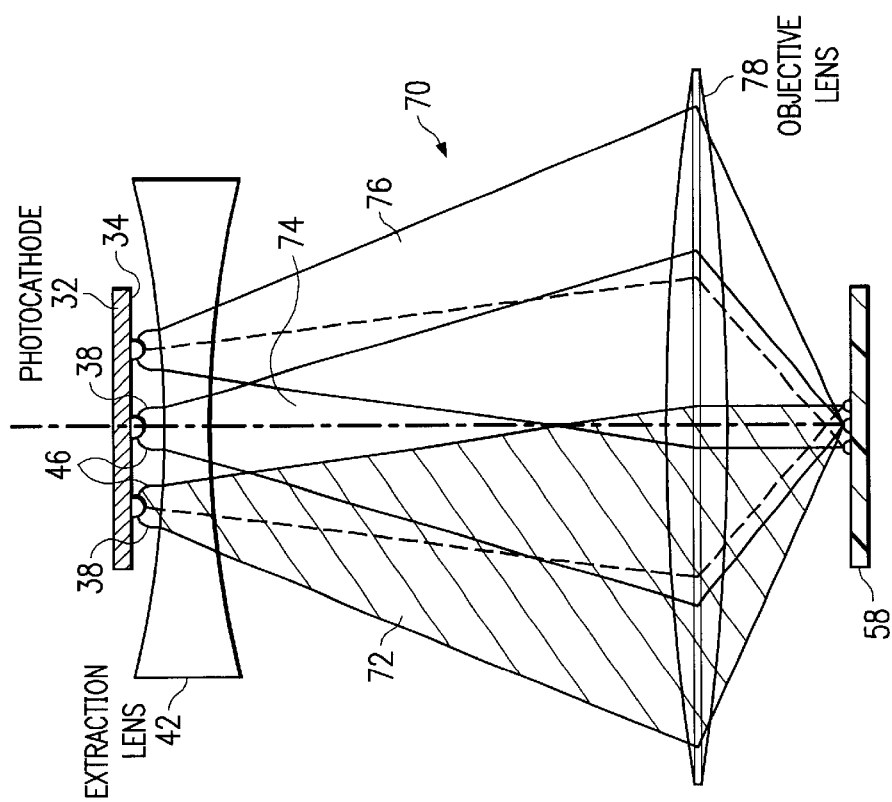
FIG. 2 illustrates a schematic side view illustrating the electron ray paths of a tandem photon and electron beam lithography system.

Referring now to FIG. 2, an embodiment 70 of a tandem photon and electron beam lithography system illustrating the ray paths is illustrated. The basic elements of the system 70 are the same or equivalent to the same elements in the tool 10 and the same numerals are utilized for explanation purposes, although not all the elements are illustrated. The optical mask 18 can be utilized between the source 14 and the lens system 28, if desired. The image 30 imposed upon the cathode 32 and the photoemission layer 34 generates the electrons 38, which are extracted by the extraction lens or electrode 42 to form the virtual image of the image 30 with the accelerated electrons 46.

The accelerated electrons 46 form a plurality of diverging electron beams 72, 74 and 76, each emitting from different portions of the photocathode 32. The diverging beams 72, 74 and 76 are incident upon an objective lens 78, but in different locations in the lens 78. The outer beams 72 and 76 thus are blurred out more than the central beam 74, as they pass through different outer locations of the objective lens 78.

Referring now to FIG. 3, an improved compact tandem photon and electron beam lithography system of the present invention is illustrated, designated generally by the reference numeral 80. Again, the basic elements of the system 80 are the same or equivalent to the same elements in the tool 10 and the same numerals are utilized for explanation purposes, although not all the elements are illustrated. As previously described, the light image incident upon the cathode 32 generates the electrons 38 which are acted upon by the extraction electrode 42 to form a plurality of diverging beams 82, 84 and 86. However, according to the present invention, a field lens 88 is added to the system 80 between the extraction lens 42 and the objective lens 78.

The field lens 88 can be a superimposed magnetic or electrostatic lens, in various configurations, which focus the divergent beams formed by the electrons 46 into a plurality of converging beams 84, 84 and 86 which now overlap at the coma free plane or back focal plane of the objective lens 78. This causes each of the beams 82, 84 and 86 to pass through the same location or portion of the lens 78. The outer beams 82 and 86 now are blurred out by the same amount as the center beam 84. This minimizes field aberrations and fills the objective lens 78 to assure the best resolution and the least image distortion over a wide imaging field due to the minimal central portion of the objective lens 78 being utilized. The objective lens 78 then demagnifies the photoemission pattern and focuses a plurality of image pattern beams 90 onto the resist layer 60 formed on the wafer 58.

The tool 10 with the lens system 50 provides a column length on the order of fifty (50) to eighty (80) centimeters (cm) between the electrode 42 and the resist 60. The length of the column causes additional blurring since the electrons can interact and interfere with one another as they travel between the electrode 42 and the resist layer 60. The conventional system 50 also generally contains four (4) lenses.

The placement of the field lens 88 closely adjacent the electrode 42, provides a very compact column on the order of ten (10) to thirty (30) cm. The compact column 80 of the present invention provides a decreased column length of at least a factor of two (2) to three (3) times that of the tool 10. This provides a sharper beam focus, with much less electron-electron interactions. This provides both a faster writing and a smaller feature size for the system 80.

The deflection system 52 (not illustrated) optionally can be located between the two lenses, 78 and 88. The system 52 also can include elements on both sides and as a portion of the objective lens 78.

Figure 4:
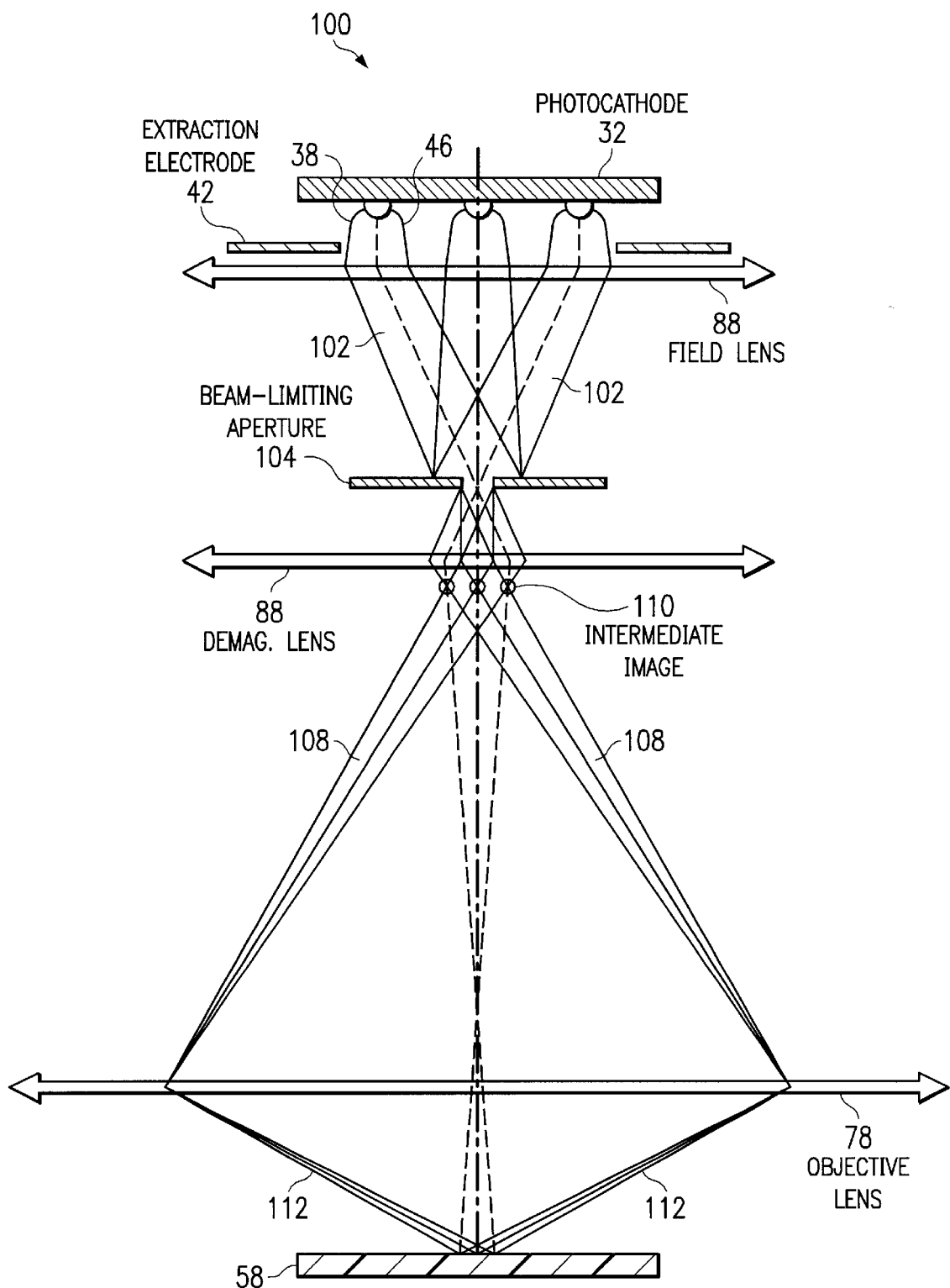
FIG. 4 illustrates a schematic side view of a second embodiment of an improved compact tandem photon and electron beam lithography system in accordance with the present invention.

Referring now to FIG. 4, a further enhanced demagnification system embodiment is designated by the reference numeral 100. The system 100 provides through the objective lens 78 a demagnification factor of about five (5). To obtain a feature size of one tenth (0.1) microns will require a system demagnification on the order of ten (10).

In the system 100, a plurality of electron beams 102 again are generated from the extraction electrode 42. However, the beams 102 are formed into converging beams by the field lens 88, which are focused through a beam-limiting aperture 104 onto a demagnification lens 106. The demagnification lens 106 forms a plurality of beams 108 which form an intermediate image 110 and then are focused on the objective lens 78, like the system 80. The objective lens 78 then focuses a plurality of image beams 112 onto the wafer 58 to form the image as before described.

As the field size increases, the aberrations due to the divergent action of extraction electrode 42 become excessive. These aberrations are too large to allow less than one hundred (100) nanometer resolution to be achieved. These aberrations are greatly reduced by utilization of the field lens 88 located closely adjacent the extraction electrode 42. The lens 88 focuses substantially all off-axial rays 46 at an optimum point near the center of the objective lens 78.

The resulting design utilizing the field lens 88 and the objective lens 78 maximizes the effective size of the pattern 30, which can be utilized, while minimizing the length of the column and substantially reducing distortion and off axis aberrations, such as astigmatism and coma. The reduction in the electron—electron interactions, due to the shorter column length, allows the total system beam current to be increased, hence increasing the throughput of the field lens systems 80 and 100.

Figure 5C:
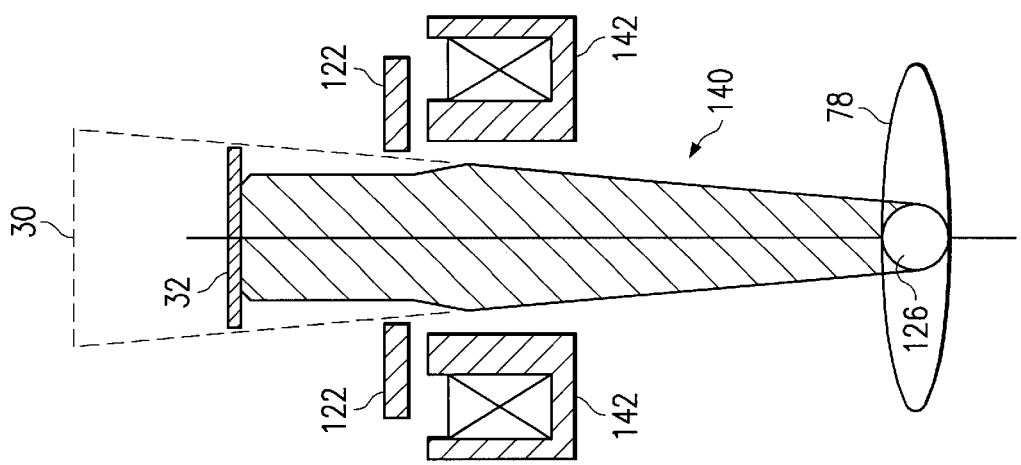
FIGS. 5A, 5B and 5C illustrate schematic side views of additional embodiments of improved compact tandem photon and electron beam lithography systems in accordance with the present invention.
Figure 5B:
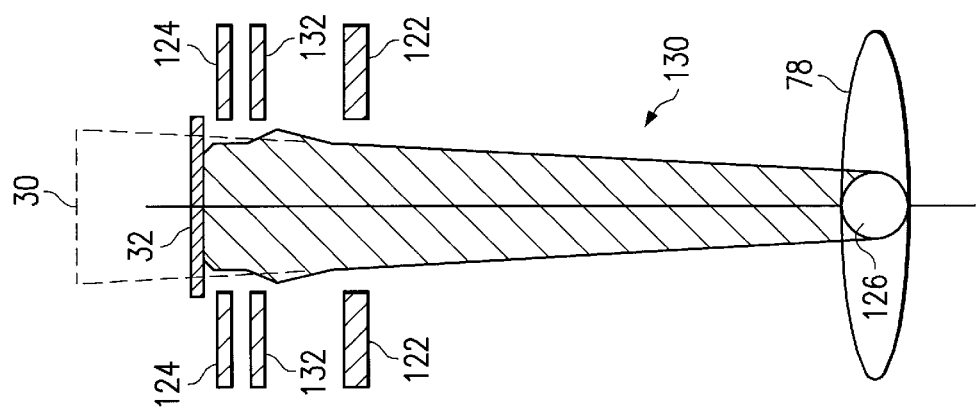
Figure 5A:
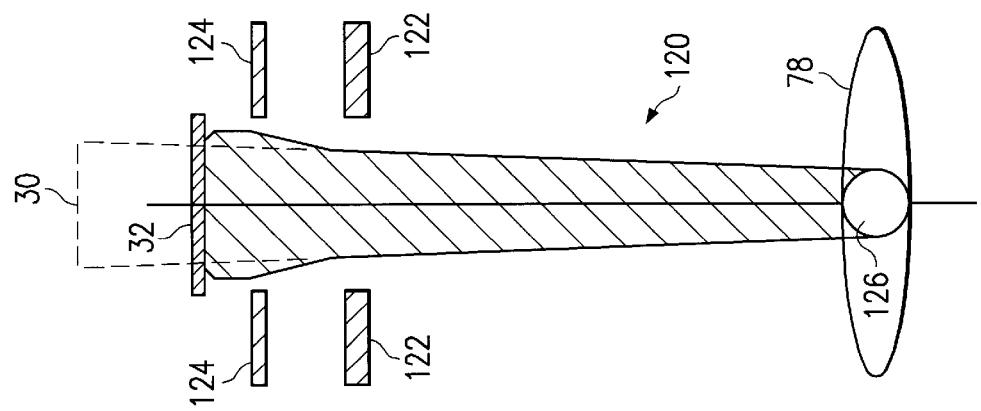

Referring now to FIGS. 5A, 5B and 5C, additional field lens embodiments of improved compact tandem photon and electron beam lithography systems of the present invention are illustrated.

In FIG. 5A, a triode field lens configuration or system is illustrated, designated generally by the reference numeral 120. The image 30 is illustrated as focused onto the photocathode 32. To minimize the field lens aberrations in this configuration, the photocathode 32 is maintained at a negative accelerating voltage and an anode 122 is maintained at ground potential. The triode configuration includes another electrode 124, positioned between the photocathode 32 and the anode 122. The electrode 124 is maintained at a negative accelerating voltage which is lower than the voltage on the photocathode 32, to form a beam crossover focused at a location 126 adjacent the objective lens 78. The location of the crossover focusing point can be altered by adjusting the shape as well as voltage of electrode 124.

In FIG. 5B, a tetrode field lens configuration or system is illustrated, designated generally by the reference numeral 130. The configuration 130 is very similar to the system 120, but with the addition of an another focusing electrode 132 to independently control the position of the crossover location 126.

In FIG. 5C, a magnetic field lens configuration or system is illustrated, designated generally by the reference numeral 140. The configuration 140 utilizes only the single anode 122, combined with a conventional or snorkle type of magnetic lens 142 to position the crossover 126 location. The systems 130 and 140 allow a higher field strength to be applied to the photocathode 32, than the system 120, thus allowing higher image resolution. The system 120, however, might have the lowest distortion of the three configurations.

Although illustrated in FIG. 1, utilizing an optical mask 18, the source 14 also can be a laser pattern generator, such as disclosed in U.S. Pat. Nos. 4,796,038 and 5,386,221. In these cases, the pattern is generated directly at the cathode 32, without the use of the mask 18.

Although the present invention has been described with reference to particular embodiments, the described embodiments are examples of the present invention and should not be taken as limitations. As will be appreciated by those skilled in the art, various other adaptations and combinations of the embodiments described herein are within the scope of the present inventions as defined by the attached claims.

We claim:

1. A method of focusing an image on a substrate, comprising:

forming an image onto a photocathode;

converting said image at said photocathode into an electron emission pattern;

accelerating said electrons in said electron emission pattern and forming an electron beam;

focusing said electron beam into a converging beam by locating a field lens configuration adjacent said photocathode; and demagnifying and focusing said converging beam onto the substrate to form said image thereon.

2. The method of claim 1, including focusing said electrons with a field lens focused at a location that minimizes distortion and field aberrations.

3. The method of claim 2, including demagnifying said beam with an objective lens and utilizing said field lens to form a converging beam focused at a location near said objective lens.

4. The method of claim 1, wherein forming an image includes illuminating a mask including opaque and transparent portions with photons to define an image and transferring said image onto said photocathode.

5. The method of claim 1, including first demagnifying and focusing said converging beam before demagnifying and focusing said beam onto said substrate.

6. The method of claim 1, including forming a triode field lens configuration.

7. The method of claim 1, including forming a tetrode field lens configuration.

8. The method of claim 1, including forming a magnetic field lens configuration.

9. A system for focusing an image on a substrate, comprising:

means for forming an image onto a photocathode;

means for converting said image at said photocathode into an electron emission pattern;

means for accelerating said electrons in said electron emission pattern, including means for forming an electron beam;

means for focusing said electron beam into a converging beam by locating a field lens configuration adjacent said photocathode; and means for demagnifying and focusing said converging beam onto the substrate to form said image thereon.

10. The system of claim 9, including means for focusing said electrons with a field lens focused at a location that minimizes distortion and field aberrations.

11. The system of claim 10, including means for demagnifying said beam with an objective lens and means for utilizing said field lens to form a converging beam focused at a location near said objective lens.

12. The system of claim 9, wherein said means for forming an image include means for illuminating a mask including opaque and transparent portions with photons to define an image and means for transferring said image onto said photocathode.

13. The system of claim 9, including means for first demagnifying and focusing said converging beam before demagnifying and focusing said beam onto said substrate.

14. The system of claim 9, including said field lens configuration formed in a triode field lens configuration.

15. The system of claim 9, including said field lens configuration formed in a tetrode field lens configuration.

16. The system of claim 9, including said field lens configuration formed in a magnetic field lens configuration.

17. A system for focusing an image on a substrate, comprising:

a source of light;

a holder for a mask that defines an image when illuminated by said light;

a photoconversion device that converts said image into an electron emission pattern;

an extractor device that accelerates said electrons in said electron emission pattern;

a field lens configuration substantially adjacent said photoconversion device that focuses said electron beam into a convergent beam; and an objective lens that demagnifies and focuses said electron beam onto said substrate to form said image thereon.

18. The system of claim 17, wherein said field lens comprises a magnetic field lens.

19. The system of claim 17, wherein said field lens comprises an electrostatic field lens.

20. The system of claim 17, wherein said field lens comprises a triode field lens.

21. The system of claim 17, wherein said field lens comprises a tetrode field lens.

22. The system of claim 17, wherein said field comprises a magnetic field lens.

* * * * *

UNITED STATES PATENT AND TRADEMARK OFFICE
CERTIFICATE OF CORRECTION

PATENT NO. : 6,215,128 B1 Page 1 of 1
DATED : April 10, 2001
INVENTOR(S) : Marion Mankos et al.

It is certified that error appears in the above-identified patent and that said Letters Patent is hereby corrected as shown below:

Column 1,
Lines 8-10, insert the following:

-- This invention was made with U.S. Government support under Contract No.: N00019-95-C-0059 awarded by the Department of the Navy. The Government has certain rights in this invention. --

Signed and Sealed this

Twenty-eighth Day of January, 2003

JAMES E. ROGAN
*Director of the United States Patent and Trademark Office*